(12) United States Patent
Stark et al.

(10) Patent No.: US 8,358,176 B2
(45) Date of Patent: Jan. 22, 2013

(54) MICROWAVE GENERATOR

(75) Inventors: Robert Stark, Bad Windsheim (DE); Jürgen Urban, Erlangen (DE)

(73) Assignee: Diehl BGT Defence GmbH & Co. KG, Nuremberg (DE)

( * ) Notice: Subject to any disclaimer, the term of this patent is extended or adjusted under 35 U.S.C. 154(b) by 819 days.

(21) Appl. No.: 12/496,725

(22) Filed: Jul. 2, 2009

(65) Prior Publication Data
US 2010/0001644 A1 Jan. 7, 2010

(30) Foreign Application Priority Data

Jul. 7, 2008 (DE) .................. 10 2008 031 625

(51) Int. Cl.
*H03B 11/02* (2006.01)
*H03B 7/10* (2006.01)
*H01P 1/04* (2006.01)
(52) U.S. Cl. .................. 331/127; 333/13; 333/222
(58) Field of Classification Search ............. 315/3, 39, 315/39.51, 39.77, 111.21; 331/127; 219/761; 367/147; 333/99 M, 13, 222
See application file for complete search history.

(56) References Cited

U.S. PATENT DOCUMENTS

| 3,351,806 A | 11/1967 | Faber et al. |
| 3,551,677 A | 12/1970 | Brewster |
| 4,741,405 A * | 5/1988 | Moeny et al. ............ 175/16 |
| 6,215,734 B1 * | 4/2001 | Moeny et al. ............ 367/147 |
| 7,215,083 B2 | 5/2007 | Staines |
| 7,439,677 B2 | 10/2008 | Dommer et al. |
| 2008/0036549 A1 | 2/2008 | Stark et al. |
| 2009/0015159 A1 | 1/2009 | Urban et al. |
| 2009/0321132 A1 * | 12/2009 | Ouellet et al. ............ 175/11 |

FOREIGN PATENT DOCUMENTS

| DE | 10 2005 022 279 A1 | 7/2006 |
| DE | 10 2005 013 925 A1 | 9/2006 |
| DE | 10 2005 044 353 A1 | 4/2007 |
| WO | 2006008000 A1 | 1/2006 |

* cited by examiner

*Primary Examiner* — Benny Lee
*Assistant Examiner* — Gerald Stevens
(74) *Attorney, Agent, or Firm* — Laurence A. Greenberg; Werner H. Stemer; Ralph E. Locher

(57) ABSTRACT

A microwave generator has a resonator with two mutually spaced resonator electrodes. The resonator electrodes provide a spark gap device which breaks down upon the application of a firing voltage between them. The spark gap device has at least two parallel-connected spark gaps.

3 Claims, 3 Drawing Sheets

MICROWAVE GENERATOR

CROSS-REFERENCE TO RELATED APPLICATION

This application claims the priority, under 35 U.S.C. §119, of German patent application DE 10 2008 031 625.3, filed Jul. 7, 2008; the prior application is herewith incorporated by reference in its entirety.

BACKGROUND OF THE INVENTION

Field of the Invention

The invention pertains to a microwave generator with a resonator having two mutually spaced resonator electrodes which provide a spark gap device that breaks down upon the application of a firing voltage applied between them.

Commonly assigned U.S. Pat. No. 7,215,083 B2 and its counterpart German published patent application DE 10 2005 002 279 A1 describe a microwave generator having two electrodes which are disposed in a housing and which are separated by way of a spark gap which breaks down when a high voltage is applied for the emission of microwaves. The outer electrode has a pot-shaped configuration and the inner electrode engages in spaced relationship at least over a part of its length on the outside thereof. The pot-shaped outer electrode has a bottom portion which at the same time forms the lateral termination of the housing. The inner electrode is rounded in a cap-shaped or hemispherical-shaped configuration and the outer electrode has a small projection in the shape of a spherical cap, wherein the two electrodes at the projection are disposed in opposite relationship at a small spacing of, for example, a few millimeters.

Commonly assigned U.S. Pat. No. 7,439,677 B2 and its counterpart German published patent application DE 10 2005 044 353 A1 also describe a microwave generator of the kind set forth hereinbefore, with a single spark gap in the form of an annular spark gap.

All those prior art microwave generators have a DS (damped sinusoid) resonator comprising a coaxial capacitor which is discharged by way of a single spark gap, that is to say a spark gap device with a single spark gap. That capacitor, with the physical properties of the switch plasma in the spark gap and in conjunction with the electrical circuitry, forms a resonant circuit comprising an ohmic resistance R, an inductance L, and a capacitance C. The capacitance is charged up by way of a charging impedance R, L to voltages into the 100 kV to MV range. Finally, in accordance with Paschen's law, the increasing charging voltage leads to breakdown of the spark gap. Breakdown of the spark gap can also be brought about deliberately by a suitable trigger mechanism.

The development of HPEM DS high power microwave sources already aims, using so-called DS technology (damped sinusoid), to generate a wideband microwave pulse and to emit into the surroundings in undirected or also directed fashion. In that respect the emitted microwave pulse typically involves a bandwidth of about 20% of what is referred to as the centre frequency at the power maximum and thus, in dependence on the mean emission frequency, covers over a certain range in the frequency spectrum. It can be seen from electromagnetic coupling-in investigations with potential target systems that the target systems involve a particular high level of sensitivity in the frequency range between some 10 MHz up into the GHz range. Therefore, to cover a target spectrum, which is as wide as possible, of different target systems, it would be desirable to cover that frequency range with as few HPEM operative systems as possible. The above-described conventional microwave generators are capable of covering a frequency range of about 50 MHz to about 450 MHz (in each case centre frequencies) so that at the present time it is possible to cover approximately an effective frequency range of about 40 MHz (lowest frequencies) to about 600 MHz (highest frequencies), using different HPEM-DS operative systems. The microwave sources known hitherto however are not in a position to also interfere with target systems with coupling-in frequencies of more than 600 MHz. Thus the range of lower frequencies, that is to say below 40 MHz, can admittedly be relatively simply optimized, by the pulse length of the system being increased or varied by clever superpositioning and reflection of the pulses in the pulse-forming network (what is referred to as "pulse forming"), but at the higher frequencies above 600 MHz, with the source architecture involved at the present time, in particular the physical properties of the switch plasma are a limiting factor which prevents the generation of frequencies above 600 MHz.

SUMMARY OF THE INVENTION

It is accordingly an object of the invention to provide a microwave generator, which overcomes the above-mentioned disadvantages of the heretofore-known devices and methods of this general type and which with a simple structure is capable of generating a wideband microwave pulse of high energy density even in a range of higher frequencies, in particular above 600 MHz.

With the foregoing and other objects in view there is provided, in accordance with the invention, a microwave generator, comprising:

a resonator having two mutually spaced resonator electrodes forming a spark gap device configured to break down upon being subjected to a firing voltage applied therebetween;

said spark gap device being formed with at least two spark gaps connected in parallel with one another.

The invention is based on the consideration that the physical properties of the spark gap, such as for example the breakdown voltage, the ambient pressure, the spacing between the spark gap electrodes, the plasma impedance and so forth, crucially determine the switching characteristics, that is to say the firing characteristics, of the spark gap discharge, and thus determine the rise time and the pulse form or the different frequency components of the high voltage pulse generated.

After breakdown of the spark gap (SG=spark gap) the energy stored in the resonator circuit is emitted entirely or partially into the environment of the microwave generator by way of an emission device coupled to the resonator, for example in the form of an antenna.

Decoupling of the oscillating circuit from the high voltage generator which, for example, involves a Marx generator is effected by impedances introduced into the charging circuit in the form of ohmic or inductive resistors. The magnitude of the energy emitted into the environment is crucially determined by impedance matching of the oscillating circuit to the environment, that is to say the surrounding space. The impedance of the free space, referred to as the free space condition impedance $Z_{FreeSp}$, is 377Ω.

In the case of ideal matching of the microwave generator to that free space impedance all the energy would be emitted in the form of a square-wave pulse. In the event of slight mismatching a part of the energy or the pulse is reflected at an impedance jump and thus in conjunction with the superpositioning of outgoing and returning wave leads to a change in the emitted pulse form. Thus suitable matching of the impedance relationship makes it possible to achieve a pulse form for the emitted pulse, which is equal to a damped sinusoidal oscillation.

In the case of an extreme mismatching the system behaves like an oscillating circuit of high quality so that energy is scarcely emitted into the environment. The energy remains in the system and leads to a resonant oscillating behavior until the energy is consumed by the internal losses of the oscillating circuit.

The number of oscillations, that is to say the quality of the oscillating circuit per pulse, can be altered by adaptation of the impedance jump. The aim sought in a microwave generator is a generated high voltage pulse, that is to say an electromagnetic pulse which passes through at least one oscillation cycle to some 10 oscillation cycles.

Against the background of the above-defined considerations the invention comes to the conclusion that, for the frequencies emitted by an HPEM-DS system, the form of the high voltage pulse generated in the DS resonator, or the configuration in respect of time of the electromagnetic pulse emitted, is decisive. More specifically, if the pulse form generated by the HPEM-DS resonator is broken down by means of a Fourier transform into its frequency components, it will be seen that the low-frequency components of the pulse are represented in particular by the pulse duration or the oscillation period of the pulse while the pulse rise time and the pulse fall time determine in particular the high-frequency components of the emitted electromagnetic pulse. Ultimately that leads to the realization that faster pulse rise and fall times can cause a boost in the higher-frequency component of the pulse in the frequency spectrum. Accordingly, the frequency component of the pulse can be shifted to higher frequencies by reducing the pulse rise time.

The resonators used in HPEM-DS systems are a pulse-forming network comprising one or more capacitors involving coaxial geometry. In that case each capacitor is connected to a spark gap as a "closing switch" which discharges the corresponding capacitor upon closure of the switch. For multi-pulse and burst applications the circuitry of the capacitors is so selected that they are sequentially discharged. The rise time and pulse form of the high voltage pulse generated in the resonator and thus the emitted frequency range of the system decisively depends on the system impedance and the external discharging circuit or the external wiring. The coaxial capacitor is short-circuited by means of spark breakdown. The capacitor or capacitors forms or form together with the spark gap (impedance of the spark gap), the integrated emission unit and the impedance of the environment, an oscillating circuit. The rise time of the high voltage pulse generated in the DS resonator is crucially determined by the plasma-physical properties of the spark gap (plasma impedance). The inherent inductance of the switch plasma in that case determines the current rise rates which can be achieved at a maximum (pulse rise time) and thus the high-frequency component in the pulse form generated.

In order to break through the limitation when shortening the pulse rise time by the inherent inductance of a spark gap a plurality of spark gaps are connected in parallel in accordance with the invention. That is preferably effected in the coaxial DS resonator geometry which is already known. Due to the simultaneous firing of n spark gaps, the discharge current is distributed to n plasma channels. As, in a parallel circuit of a plurality of inductors, the total inductance of the system behaves like the inverse value of the sum of the reciprocal values of the individual systems the inductance of the overall system in the ideal case is reduced in inverse proportional relationship to the number of spark gaps operated at the same time.

The reduction in plasma inductance by the parallel connection of a plurality of spark gaps thus reduces the rise time of the high voltage pulse generated in the DS resonator. That in turn results in an increase in the high-frequency components in the pulse form emitted.

In that respect the arrangement of the at least two spark gaps in a parallel circuit can be effected in ordered geometrical form, linearly, coaxially, symmetrically or also randomly distributed, between the two resonator electrodes. Random distribution of the spark gaps between the two resonator electrodes can be effected as long as the functionality of the resonator is not adversely affected thereby. It is possible to implement both identical and also different geometries for the electrodes in the individual spark gaps. For the above-described mode of operation of the parallel-connected spark gaps it is particularly advantageous if the following prerequisites are met:

a. The spacing of the spark gap electrodes of the individual parallel-connected spark gaps is equal or at least sufficiently equal so that the Townsend firing condition, corresponding to Paschen's law, is met for all spark gaps and the discharge is distributed to the different spark gaps within a jitter acceptable for the application.

b. The high voltage pulse afforded by the energy supply of the system is coupled sufficiently quickly in low-inductive manner to the resonator. The DS resonator is of a sufficiently low-inductive structure so that the rise time of the high voltage pulse at the individual multi-channel spark gaps is sufficiently fast so that the statistical firing processes at the multi-channel spark gap electrodes which determine the build-up mechanism in respect of time of the plasma channel (discharge channel between the spark gap electrodes) are to be disregarded in relation to each other and simultaneous firing of the spark gaps is thus ensured in a suitably short time range which is sufficient for this application. The rise time of the pulse which is overall emitted by the discharge of the capacitor into the surrounding space is then crucially determined by the jitter in respect of time of the individual discharges (spark gaps) among each other and the inductance of the spark gap plasma.

Due to the almost simultaneous firing of the n spark gaps (a certain jitter in respect of time, caused by statistical processes in the plasma, will always occur), the discharge and thus the discharge current of the resonator is distributed to a plurality of and more specifically n plasma channels. Due to the parallel circuit of the plasma discharges, the plasma inductances of the individual spark gaps are reciprocally added so that the overall inductance of the discharge in a first approximation falls in inversely proportional relationship to the number of available spark gaps. Operation of a plurality of spark gaps in parallel relationship therefore makes it possible to reduce the inductance of the overall system. Accordingly, the reduction in plasma inductance means that there is a fall in the rise time of the high voltage pulse generated in the DS resonator, which in turn has the consequence that the frequency component of the DS pulse generated is displaced towards higher frequencies which are then emitted into the environment by way of the emission unit which is integrated into the resonator and suitably adapted to the frequency range.

A further aspect of the present invention is also that, at the same time as the parallel connection of a plurality of plasma channels, the total power loss (ohmic components) in the spark gaps is also reduced, which contributes to an increase in the efficiency of the DS resonator system. In addition, in comparison with an individual spark gap system, the lower loading (lower current density on the electrode surface) means that the erosion mechanisms on the electrode surfaces are reduced and thus their service life is increased.

Other features which are considered as characteristic for the invention are set forth in the appended claims.

Although the invention is illustrated and described herein as embodied in a microwave generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
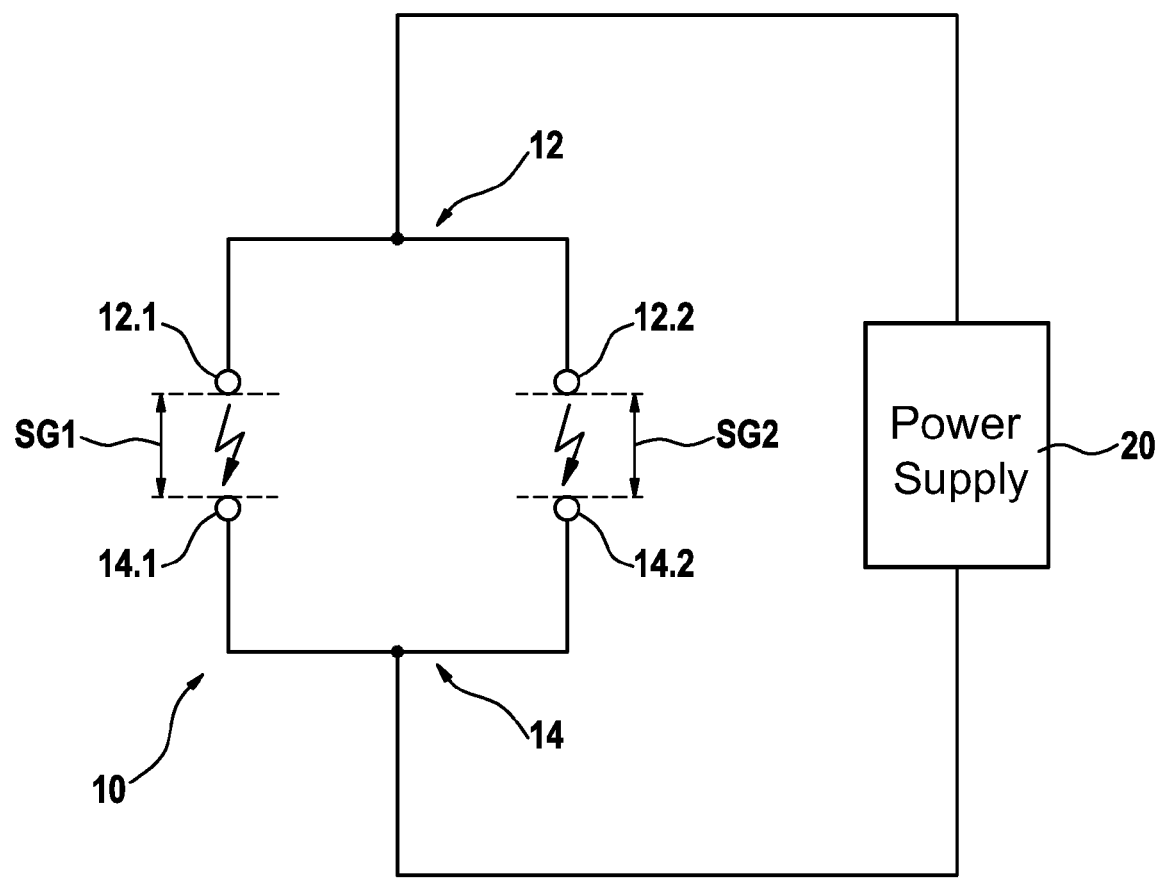
FIG. 1 shows a diagrammatic view of the microwave generator according to the invention.

Referring now to the figures of the drawing in detail and first, particularly, to FIG. 1 thereof, there is shown a diagrammatic view of a microwave generator according to the invention. This microwave generator includes a resonator having two mutually spaced resonator electrodes 12 and 14. A voltage can be generated between the two resonator electrodes 12, 14 by way of a power supply 20. If the voltage applied between the resonator electrodes 12, 14 is increased to the firing voltage, discharge of the voltage occurs between the resonator electrodes 12, 14 through the spark gap device 10. In that respect, in accordance with the invention, the spark gap device 10 has at least two parallel-connected spark gaps SG1, SG2. In that case the spark gap SG1 is formed between a predetermined location 12.1 of the one resonator electrode 12 and a predetermined location 14.1 of the other resonator electrode 14. A corresponding consideration applies to the second spark gap SG2 and any spark gaps SGn which are possibly further provided.

The discharge current is distributed to n plasma channels by virtue of the parallel connection of the plurality of spark gaps SGn or the simultaneous discharge thereacross. As, in a parallel connection of a plurality of inductors, the overall inductance of the system behaves like the inverse value of the sum of the reciprocal values of the individual systems the inductance of the overall system is reduced in inverse proportion to the number of simultaneously operated spark gaps SGn. The reduction in the plasma inductance due to the parallel connection of a plurality of spark gaps SGn thus reduces the rise time of the high voltage pulse generated in the DS resonator, which in turn results in an increase in the high-frequency components in the pulse form emitted.

Preferably the spacing of the resonator electrodes 12, 14 in the region of the provision of each of the spark gaps SGn is reduced to a substantially equal smaller spacing. That means on the one hand that the length of the spark gaps SG1 and SG2 is equal and on the other hand that the spacing of the resonator electrodes 12, 14 from each other is minimal in the region of the provision of the spark gaps SGn. That combination of features has the advantage that as a result the number of plasma channels between the resonator electrodes 12, 14 can be exactly predetermined upon discharge of the spark gap device 10 after attainment of the firing voltage as the breakdown preferably occurs at the locations involving the minimum spacing between the electrodes. The fact that the length of all spark gaps is equal can provide that all spark gaps simultaneously involve breakdown.

Figure 2:
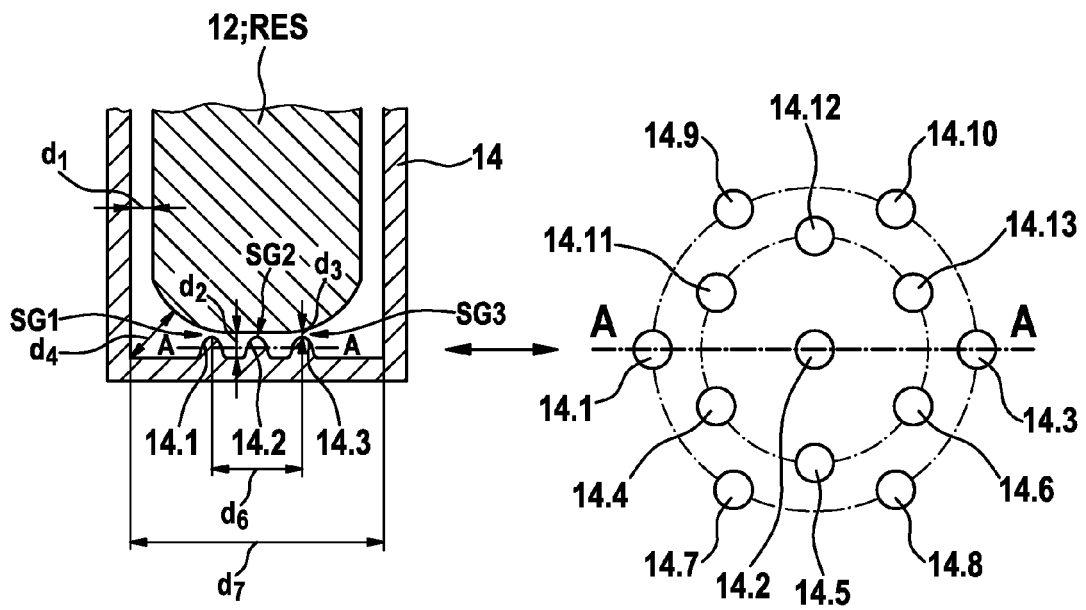
FIG. 2 shows sectional views of a first embodiment of the microwave generator according to the invention.
Figure 3:
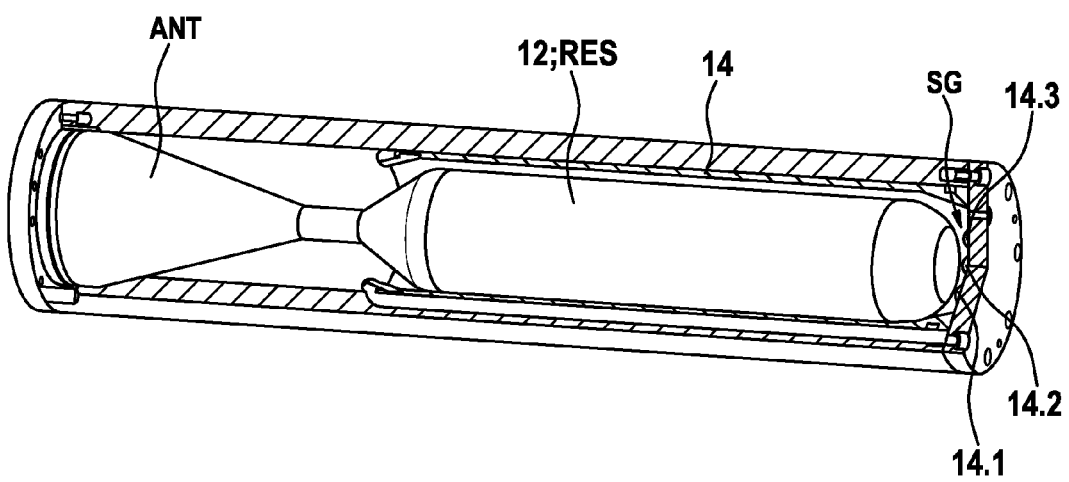
FIG. 3 is a partly sectional, perspective view of the first embodiment of the microwave generator as shown in FIG. 2.

FIG. 2 shows a first embodiment of the microwave generator according to the invention, in two sectional views. FIG. 3 shows a perspective view of the same embodiment.

As can be seen from the views in FIGS. 2 and 3 the microwave generator in accordance with the first embodiment has a resonator involving a coaxial structure. In this case the resonator has an inner electrode 12 substantially in the form of a cylindrical casing and an outer electrode 14 which surrounds the inner electrode. The inner electrode 12 is closed at the lower end. That closed end of the inner electrode 12 is opposite an end face which closes off the outer electrode 14. The outer electrode 14 has projections 14.1, 14.2, 14.3 projecting in the direction towards the inner electrode 12 so that the spacing $d_3$ between the electrodes in the region of the projections 14.1, 14.2, 14.3 is less than each spacing $d_1$, $d_2$, $d_4$ between the electrodes outside the region of the projections. In that case the spacings $d_3$ between the electrodes 12, 14 in the region of the projections 14.1, 14.2, 14.3 from each other are substantially identical. In general $d_1$, $d_2$ and $d_4$ can be freely selected and the following applies: $d_1$, $d_2$, $d_4 > d_3$. In accordance with a special case the following can apply: $d_1 = d_2 = d_4 > d_3$ and $d_7 >= d_6 > 0$.

The right-hand part of FIG. 2 shows a possible arrangement of the projections 14.n on the terminating end face of the outer electrode 14. In a special case this involves 13 projections. However more or fewer projections are also possible, and also in a different arrangement which, for example, may also be non-symmetrical.

The perspective view in FIG. 3 also applies to the embodiments described hereinafter and shown in FIGS. 4, 5, and 6.

Figure 4:
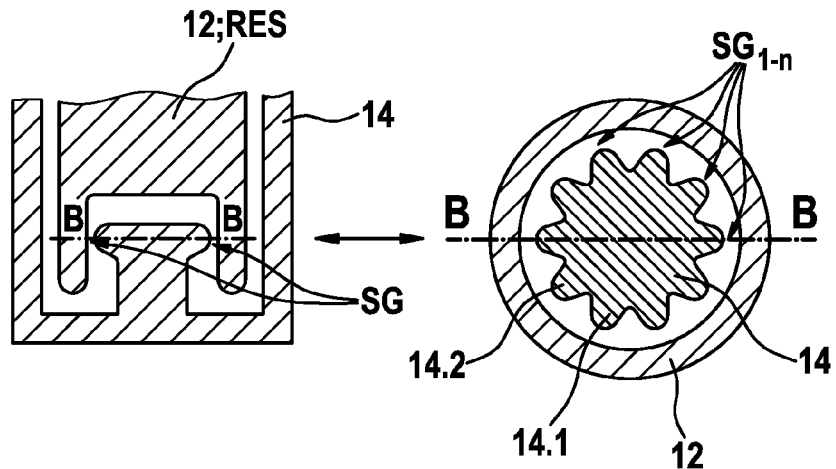
FIG. 4 shows sectional views of a second embodiment of the microwave generator according to the invention.

FIG. 4 shows a second embodiment of the microwave generator according to the invention, in two sectional views. Here the one end of the inner electrode 12 is opposite an end face which closes off the outer electrode 14. A mushroom-shaped pin projects coaxially from that end face of the outer electrode 14 into the interior of the inner electrode 12. In this case, at least at its widest location, the mushroom-shaped pin has a wave-shape cross-sectional surface. In that way, formed in that region are ribs 14.1, 14.2, 14.n which are opposite the cylindrical inside wall of the inner electrode 12. The spark gaps SGn formed by the ribs 14.n are all of equal size.

The advantage of the second embodiment lies on the one hand in the relatively homogenous field between the ribs 14.n and the cylindrical inside wall of the inner electrode 12. On the other hand this embodiment is advantageous for the reason that it represents a subsequent option for adaptation of a conventional microwave generator. Thus for example the mushroom-shaped pin can be subsequently screwed from below into the terminating end face of the outer electrode 14 to convert a conventional microwave generator into a microwave generator according to the invention.

Figure 5:
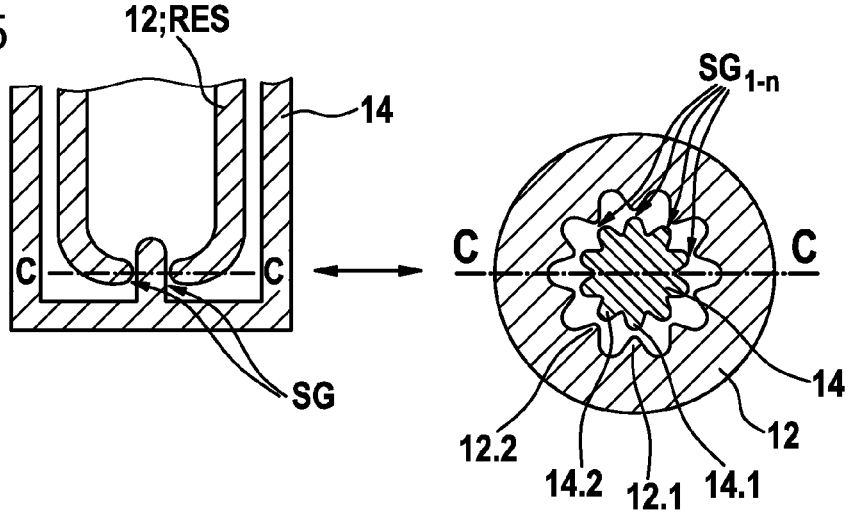
FIG. 5 shows sectional views of a third embodiment of the microwave generator according to the invention.

A third embodiment of the microwave generator according to the invention is shown in FIG. 5 in two sectional views. In this case also the one end of the inner electrode 12 is opposite an end face which closes off the outer electrode 14. From the end face of the outer electrode 14 a pin with ribs 14.1, 14.2, 14.n and notches projects coaxially into the interior of the inner electrode 12. The pin therefore has a wave-shape cross-sectional surface. In addition the end of the inner electrode 12 also has projections 12.1, 12.2, 12.n protruding in the direction of the pin, which are in opposite relationship to the ribs on the pin.

The third embodiment is admittedly somewhat more critical than the second embodiment as regards the homogeneity of the electrical field in the spark gaps SGn, but with precise orientation of the ribs 14.n and 12.n relative to each other spatially it is possible to implement very accurately delimited plasma channels which advantageously have properties which can be more accurately predefined, such as for example discharge current and plasma inductance.

Figure 6:
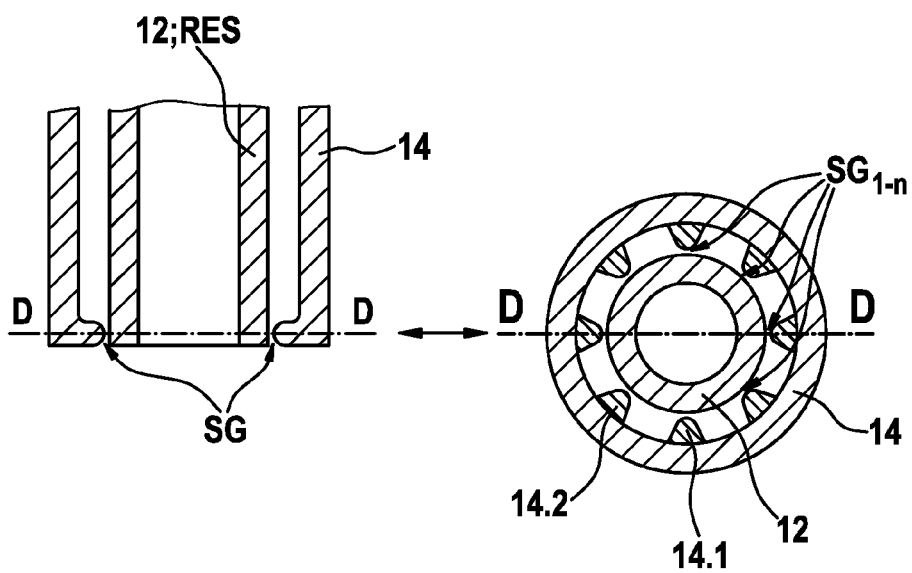
FIG. 6 shows sectional views of a fourth embodiment of the microwave generator according to the invention.

FIG. 6 shows a fourth embodiment of the microwave generator according to the invention, in two sectional views. Here the outer electrode 14, at one end, has cam-shaped projections 14.1, 14.2, 14.n extending in the direction of the cylindrical inner electrode 12. In this case the cylindrical inner electrode 12 itself does not have any projections.

This fourth embodiment combines the advantages of the second and third embodiments, for here the electrical field in the spark gaps SGn, by virtue of the less severely curved outside surface of the inner electrode 12, is still sufficiently homogenous, but at the same time the provision of the spark gaps SGn is restricted to a sufficiently small spatial region by virtue of the surfaces, which respectively face convexly away from each other, of the cam projections 14.n and the cylindrical outside surface of the inner electrode 12.

It should be emphasized that FIGS. 2 to 6 only show a small selection of possible spark gap configurations which comply with the required boundary conditions. In addition many other geometrical arrangements can also be envisaged. In general it is advantageous, in designing the spark gap configurations, to ensure that the minimum electrode spacing in the individual spark gaps is so dimensioned that at the desired time (switching time) and upon application of the corresponding switching voltage in the switching operation the firing condition in accordance with Paschen's law is satisfied for each individual spark gap and thus sufficiently precise firing of the spark gaps in respect of time, that is to say simultaneously, is ensured. On the other hand it is advantageously to be ensured that charging of the resonator and thus charging of the spark gap electrodes takes place sufficiently rapidly so that, together with the fulfillment of the firing condition, there is time-synchronous discharge implementation in the individual spark gaps. Simultaneous parallel firing of the spark gaps provides a reduction in the overall impedance of the spark gaps, whereby a more rapid pulse rise can be implemented, which ultimately leads to an increase in the emitted frequency spectrum in the range of higher frequencies.

The invention claimed is:

1. A microwave generator, comprising:
a resonator having two mutually spaced resonator electrodes forming a spark gap device configured to break down upon being subjected to a firing voltage applied therebetween;
said spark gap device being formed with at least two spark gaps connected in parallel with one another, said resonator electrodes being disposed with a defined spacing, and the spacing of said resonator electrodes being reduced at said spark gaps to a substantially identical smaller spacing;
said resonator electrodes being disposed to form a coaxial resonator structure with an inner electrode substantially in the form of a cylindrical casing and an outer electrode surrounding said inner electrode, at least one of said inner electrode and said outer electrode being formed with projections projecting in a direction towards the respectively opposite said electrode, defining spacing distances between said electrodes in the region of said projections less than each spacing distance between said electrodes outside the region of said projections, and said spacing distances between said electrodes in the region of said projections being substantially identical to one another, said inner electrode being closed at one end by a closed end disposed opposite from an end face that closes off said outer electrode, said projections being formed in a region of said closed end of said inner electrode and/or in a region of said end face of said outer electrode.

2. The microwave generator according to claim 1, which further comprises a power supply and wherein a high voltage pulse provided by said power supply is low-inductively coupled to said resonator.

3. The microwave generator according to claim 2, wherein said power supply is a device selected from the group consisting of a Marx generator, a Tesla transformer, a piezoelectric generator, and a flux compression generator with electro explosive opening switch.

* * * * *